(12) United States Patent
Kobayashi et al.

(10) Patent No.: US 12,374,526 B2
(45) Date of Patent: Jul. 29, 2025

(54) PLASMA PROCESSING APPARATUS AND PLASMA PROCESSING METHOD

(71) Applicant: Tokyo Electron Limited, Tokyo (JP)

(72) Inventors: Takeshi Kobayashi, Iwate (JP); Hiroyuki Kikuchi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 748 days.

(21) Appl. No.: 17/242,150

(22) Filed: Apr. 27, 2021

(65) Prior Publication Data

US 2021/0351005 A1    Nov. 11, 2021

(30) Foreign Application Priority Data

May 11, 2020  (JP) .................. 2020-083485

(51) Int. Cl.
| | |
|---|---|
| *H01J 37/32* | (2006.01) |
| *C23C 16/455* | (2006.01) |
| *C23C 16/458* | (2006.01) |
| *C23C 16/509* | (2006.01) |
| *C23C 16/52* | (2006.01) |
| *H01L 21/02* | (2006.01) |
| *H01L 21/687* | (2006.01) |

(52) U.S. Cl.
CPC .. *H01J 37/32091* (2013.01); *C23C 16/45544* (2013.01); *C23C 16/4584* (2013.01); *C23C 16/509* (2013.01); *C23C 16/52* (2013.01); *H01J 37/3244* (2013.01); *H01J 37/32715* (2013.01); *H01L 21/02164* (2013.01); *H01L 21/02274* (2013.01); *H01L 21/0228* (2013.01); *H01L 21/68764* (2013.01); *H01J 2237/20214* (2013.01); *H01J 2237/332* (2013.01)

(58) Field of Classification Search
CPC ............ H01J 37/32091; H01J 37/3244; H01J 37/32715; H01J 2237/332; H01J 2237/20214; C23C 16/45544; C23C 16/4584; C23C 16/509; C23C 16/52; H01L 21/68764; H01L 21/68771; H01L 21/02164; H01L 21/02274; H01L 21/0228
See application file for complete search history.

(56) References Cited

U.S. PATENT DOCUMENTS

| | | | | |
|---|---|---|---|---|
| 6,072,147 A | * | 6/2000 | Koshiishi .......... | H01J 37/32174 216/68 |
| 2001/0037857 A1 | * | 11/2001 | Kazumi ............ | H01J 37/32174 156/345.48 |
| 2003/0196601 A1 | * | 10/2003 | Murayama ........ | H01J 37/32183 156/345.44 |

(Continued)

FOREIGN PATENT DOCUMENTS

| | | |
|---|---|---|
| JP | H10-083898 A | 3/1998 |
| JP | H11-074098 A | 3/1999 |

(Continued)

*Primary Examiner* — Charlee J. C. Bennett
(74) *Attorney, Agent, or Firm* — Venjuris, P.C.

(57) ABSTRACT

A plasma processing apparatus includes a vacuum container and a plasma source that generates plasma in the vacuum container. The plasma source includes an antenna, an RF power supply connected to one end of the antenna and configured to supply an RF power to the antenna, and a variable capacitor connected to the other end of the antenna and having a variable capacitance.

12 Claims, 10 Drawing Sheets

(56) References Cited

U.S. PATENT DOCUMENTS

| | | | | |
|---|---|---|---|---|
| 2005/0087305 A1* | 4/2005 | Nishio | ............... | H01J 37/32477 156/345.51 |
| 2006/0225657 A1* | 10/2006 | Mizushima | ......... | H01L 21/0217 118/724 |
| 2011/0303643 A1* | 12/2011 | Wada | ................ | H01J 37/32577 156/345.43 |
| 2014/0367043 A1* | 12/2014 | Bishara | ............. | H01J 37/32165 315/111.21 |
| 2015/0126044 A1* | 5/2015 | Kato | ................... | H01L 21/0228 118/723 R |
| 2017/0366173 A1* | 12/2017 | Miller | .................... | H02M 11/00 |
| 2019/0136377 A1* | 5/2019 | Honma | .................... | C23C 16/52 |

FOREIGN PATENT DOCUMENTS

| | | |
|---|---|---|
| JP | 2019-165078 A | 9/2019 |
| KR | 19980042744 A | 8/1998 |

* cited by examiner

PLASMA PROCESSING APPARATUS AND PLASMA PROCESSING METHOD

CROSS-REFERENCE TO RELATED APPLICATIONS

This application is based on and claims priority from Japanese Patent Application No. 2020-083485 filed on May 11, 2020 with the Japan Patent Office, the disclosure of which is incorporated herein in its entirety by reference.

TECHNICAL FIELD

The present disclosure relates to a plasma processing apparatus and a plasma processing method.

BACKGROUND

An ALD film forming apparatus of a rotary table type is known which performs a film formation according to the ALD method by rotating a rotary table with a substrate placed thereon (see, e.g., Japanese Laid-Open Patent Application No. 2019-165078). The technology of the patent document removes oxygen and oxygen radicals adhering to the surface of the plasma processing area in a state where plasma is being generated, after a film forming process and a modifying process are completed, to return the state where electrons are easily captured to a normal state where electrons are neutral, thereby suppressing the delay of plasma ignition.

SUMMARY

According to an aspect of the present disclosure, a plasma processing apparatus includes a vacuum container and a plasma source that forms plasma in the vacuum container. The plasma source includes an antenna, an RF power supply connected to one end of the antenna and configured to supply an RF power to the antenna, and a variable capacitor connected to the other end of the antenna and having a variable capacitance.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
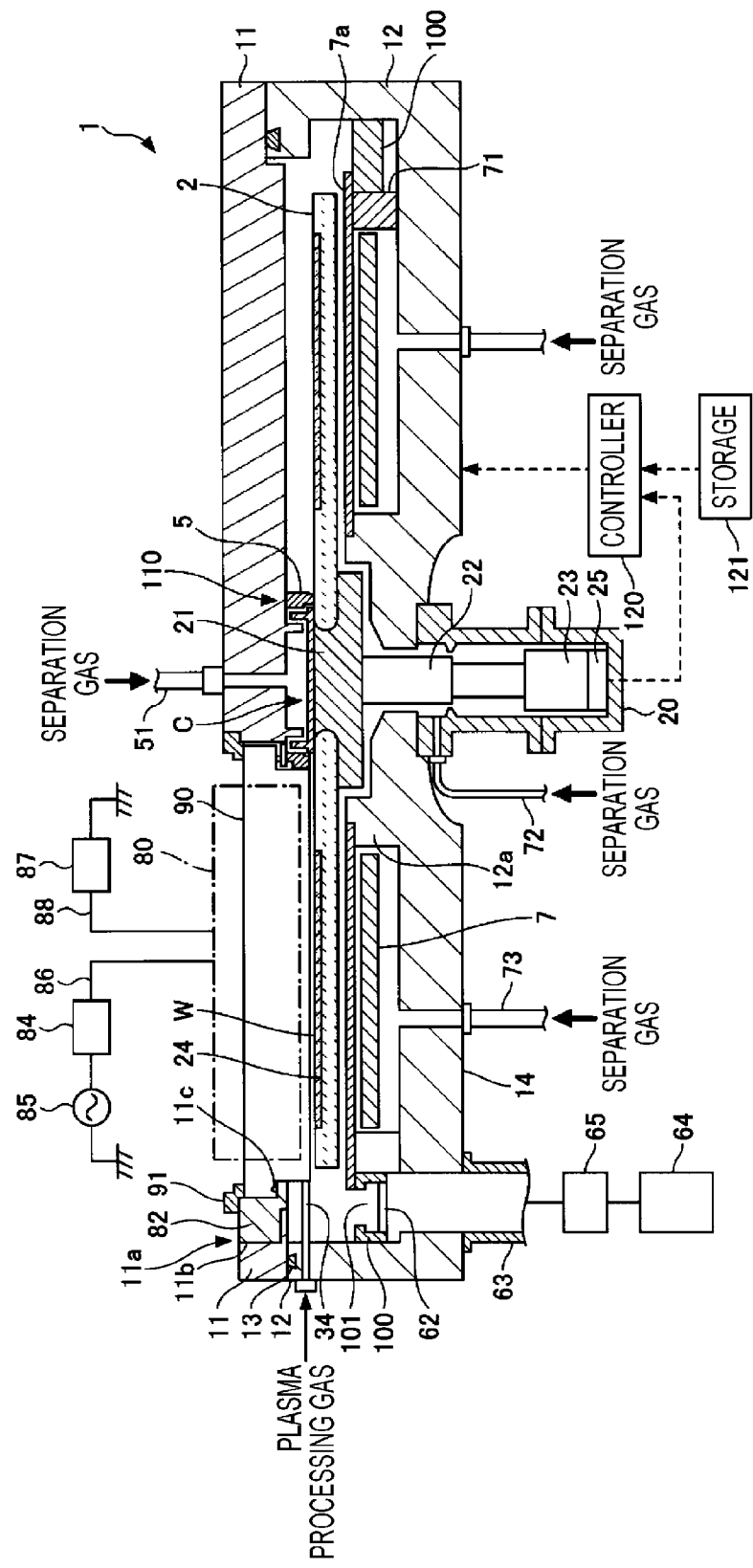
FIG. 1 is a cross-sectional view illustrating an example of a configuration of a plasma processing apparatus according to an embodiment.

In the following detailed description, reference is made to the accompanying drawings which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. Throughout the drawings, the same or corresponding members or parts will be designated by the same or corresponding reference numerals, and overlapping descriptions will be omitted.

[Plasma Processing Apparatus]

Figure 2:
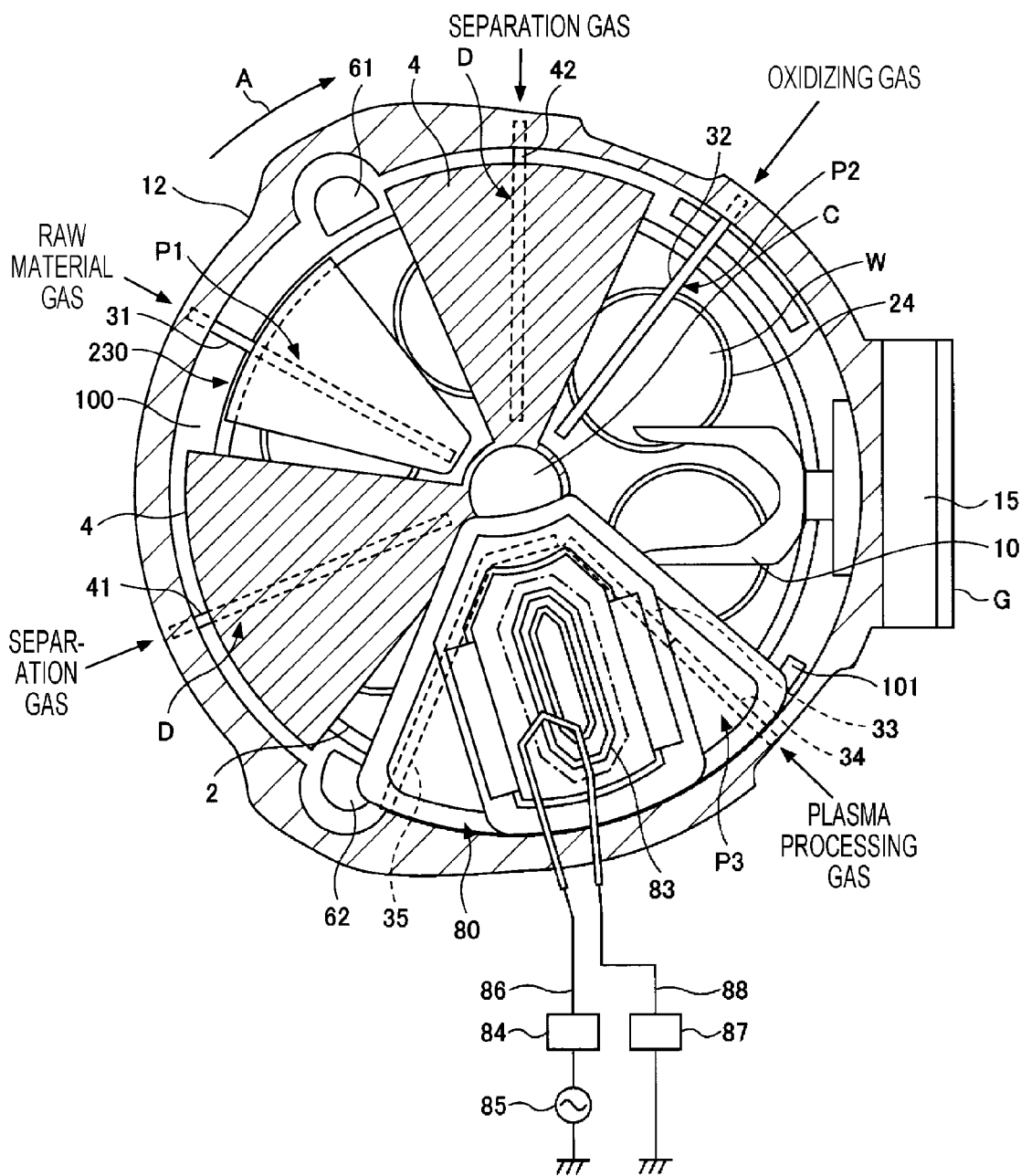
FIG. 2 is a plan view of the plasma processing apparatus of FIG. 1.

An example of a configuration of a plasma processing apparatus according to an embodiment will be described with reference to FIGS. 1 to 10. FIG. 1 is a cross-sectional view illustrating an example of the configuration of the plasma processing apparatus according to the embodiment. FIG. 2 is a plan view of the plasma processing apparatus of FIG. 1. For the convenience of descriptions, FIG. 2 omits the illustration of a ceiling plate 11.

As illustrated in FIG. 1, the plasma processing apparatus includes a vacuum container 1 having a substantially circular planar shape, and a rotary table 2 provided inside the vacuum container 1, having a rotation center at the center of the vacuum container 1, and configured to revolve wafers W.

The vacuum container 1 is a processing chamber that accommodates the wafer W to perform a film forming process and deposit a thin film on the surface of the wafer W. The vacuum container 1 includes a ceiling plate 11 provided at a position that faces a recess 24 of the rotary table 2 (to be described later), and a container body 12. A seal member 13 is provided in an annular shape at the peripheral edge of the upper surface of the container body 12. The ceiling plate 11 is configured to be detachable from the container body 12. The diameter dimension (the inner diameter dimension) of the vacuum container 1 in the plan view is not limited, but may be, for example, about 1,100 mm.

A separation gas supply pipe 51 is connected to the internal center of the vacuum container 1 close to the upper surface thereof to supply a separation gas in order to suppress different processing gases from being mixed with each other in a central area C inside the vacuum container 1.

The rotary table 2 is fixed to a substantially cylindrical core 21 at the center thereof, and is configured to be rotatable by a driving unit 23 around the vertical axis clockwise in the example illustrated in FIG. 2 with respect to a rotary shaft 22 that is connected to the lower surface of the core 21 and extends vertically. The diameter dimension of the rotary table 2 is not limited, but may be, for example, about 1,000 mm.

The driving unit 23 is provided with an encoder 25 that detects the rotation angle of the rotary shaft 22. In the embodiment, the rotation angle of the rotary shaft 22 detected by the encoder 25 is transmitted to a controller 120, and used when the controller 120 specifies a position of the wafer W placed in each recess 24 of the rotary table 2.

The rotary shaft 22 and the driving unit 23 are accommodated in a housing body 20. A flange on the upper surface of the housing body 20 is airtightly attached to the lower surface of the bottom 14 of the vacuum container 1. A purge gas supply pipe 72 is connected to the housing body 20 to supply Ar gas or the like as a purge gas (separation gas) to the area below the rotary table 2.

The portion of the bottom 14 of the vacuum container 1 close to the outer periphery of the core 21 is formed in an annular shape to form a protrusion 12a so as to approach the rotary table 2 from below.

The recess 24 having a circular shape is formed in the surface of the rotary table 2, to place a wafer W having a diameter dimension of, for example, 300 mm therein. The recess 24 is provided at each of a plurality of, for example, six positions along the rotation direction of the rotary table 2 (the direction indicated by an arrow A in FIG. 2). The recess 24 has an inner diameter which is slightly, for example, about 1 mm to 4 mm larger than the diameter of the wafer W. The depth of the recess 24 is configured to be substantially equal to or larger than the thickness of the wafer W. Accordingly, when the wafer W is accommodated in the recess 24, the surface of the wafer W is flush with the surface of the flat area of the rotary table 2 where no wafer W is placed, or the height of the surface of the wafer W becomes lower than that of the rotary table 2. Further, through holes (not illustrated) are formed in the bottom surface of the recess 24 such that, for example, three lifting pins (to be described later) penetrate the holes to lift the wafer W by pushing up the wafer W from below.

As illustrated in FIG. 2, a first processing area P1, a second processing area P2, and a third processing area P3 are provided to be spaced apart from each other along the rotation direction of the rotary table 2. A plurality of, for example, seven gas nozzles 31 to 35, 41, and 42 made of, for example, quartz are arranged radially at intervals in the circumferential direction of the vacuum container 1, at the positions that face the areas through which the recess 24 passes in the rotary table 2.

Each of the gas nozzles 31 to 35, 41, and 42 is disposed between the rotary table 2 and the ceiling plate 11. For example, each of the gas nozzles 31 to 34, 41, and 42 is attached to extend horizontally from the outer peripheral wall of the vacuum container 1 toward the central area C while facing the rotary table 2. Meanwhile, the gas nozzle 35 extends from the outer peripheral wall of the vacuum container 1 toward the central area C, and then, bends to extend linearly counterclockwise (in the direction opposite to the rotation direction of the rotary table 2) along the central area C.

In the example illustrated in FIG. 2, the plasma processing gas nozzles 33 to 35, the separation gas nozzle 41, the first processing gas nozzle 31, the separation gas nozzle 42, and the second processing gas nozzles 32 are arranged in this order from a transfer port 15 (to be described later) clockwise (in the rotation direction of the rotary table 2). While the second processing gas nozzle 32 mostly supplies the same gas as that supplied by the plasma processing gas nozzles 33 to 35, the second processing gas nozzle 32 may not necessarily be provided when the gas is sufficiently supplied by the plasma processing gas nozzles 33 to 35.

Further, instead of the plasma processing gas nozzles 33 to 35, one plasma processing gas nozzle may be used. In this case, for example, a plasma processing gas nozzle may be provided to extend from the outer peripheral wall of the vacuum container 1 toward the central area C, similarly to the second processing gas nozzle 32.

The first processing gas nozzle 31 serves as a first processing gas supply. The second processing gas nozzle 32 serves as a second processing gas supply. Each of the plasma processing gas nozzles 33 to 35 serves as a plasma processing gas supply. Each of the separation gas nozzles 41 and 42 serves as a separation gas supply.

Each of the gas nozzles 31 to 35, 41, and 42 is connected to a gas supply source (not illustrated) via a flow rate regulating valve.

Gas ejection holes 36 are formed at a plurality of positions, for example, with equal intervals in the lower surface of each of the gas nozzles 31 to 35, 41, and 42 (the surface that faces the rotary table 2) along the radial direction of the rotary table 2 to eject each gas described above. The gas nozzles 31 to 35, 41, and 42 are arranged such that the distance between the lower end edge of each of the gas nozzles 31 to 35, 41, and 42 and the upper surface of the rotary table 2 is, for example, about 1 mm to 5 mm.

The area below the first processing gas nozzle 31 is the first processing area P1 where a raw material gas is adsorbed onto the wafer W, and the area below the second processing gas nozzle 32 is the second processing area P2 where an oxidizing gas capable of oxidizing the raw material gas to generate an oxide is supplied to the wafer W. Further, the area below the plasma processing gas nozzles 33 to 35 is the third processing area P3 where a modifying process of a film on the wafer W is performed.

The first processing gas nozzle 31 supplies a silicon-containing gas when a silicon oxide film or a silicon nitride film is formed, and supplies a metal-containing gas when a metal oxide film or a metal nitride film is formed. In this way, the first processing gas nozzle 31 supplies a raw material gas containing a raw material which is a main component of a thin film (precursor). Accordingly, the first processing gas nozzle 31 will also be referred to as a raw material gas nozzle 31. Further, the first processing area P1 is an area where the raw material gas is adsorbed onto the wafer W, and thus, will also be referred to as a raw material gas adsorption area P1.

Similarly, the second processing gas nozzle 32 supplies an oxidizing gas such as oxygen, ozone, water, or hydrogen peroxide to the wafer W when an oxide film is formed, and thus, will also be referred to as an oxidizing gas nozzle 32. Further, the second processing area P2 is an area where the oxidizing gas is supplied to the wafer W onto which the raw material gas has been adsorbed in the first processing area P1, to oxidize the raw material gas adsorbed onto the wafer W, and thus, will also be referred to an oxidizing area P2. In the oxidizing area P2, the molecular layer of the oxide film is deposited on the wafer W.

Similarly, the third processing area P3 is an area where the molecular layer of the oxide film formed in the second processing area P2 is subjected to a plasma processing to modify the oxide film, and thus, will also be referred to as a plasma processing area P3. In the embodiment, since the oxide film is formed, the plasma processing gas supplied from the plasma processing gas nozzles 33 to 35 is, for example, a gas containing oxygen. However, when a nitride film is formed, the plasma processing gas supplied from the plasma processing gas nozzles 33 to 35 is, for example, a gas containing nitrogen.

The separation gas nozzles 41 and 42 are provided to form separation areas D that separate the first processing area P1 and the second processing area P2 from each other, and separate the third processing area P3 and the first processing area P1 from each other. The separation gas supplied from each of the separation gas nozzles 41 and 42 is an inert gas such as nitrogen or a rare gas such as helium or argon. Since the separation gas also functions as a purge gas, the separation gas may also be referred to as a purge gas, and the separation gas nozzles 41 and 42 may also be referred to as purge gas nozzles 41 and 42. Further, no separation area D is provided between the second processing area P2 and the third processing area P3. This is because the oxidizing gas supplied in the second processing area P2 and the oxygen gas included in the mixed gas supplied in the third processing area P3 commonly contain oxygen atoms, and function as oxidants, so that the second processing area P2 and the third processing area P3 do not need to be separated from each other using a separation gas.

Further, since the plasma processing gas nozzles 33 to 35 are configured to supply gases to different areas on the rotary table 2, the flow rate ratio of respective components of the mixed gas may be different for each area, such that the modifying process is formed uniformly as a whole.

Figure 3:
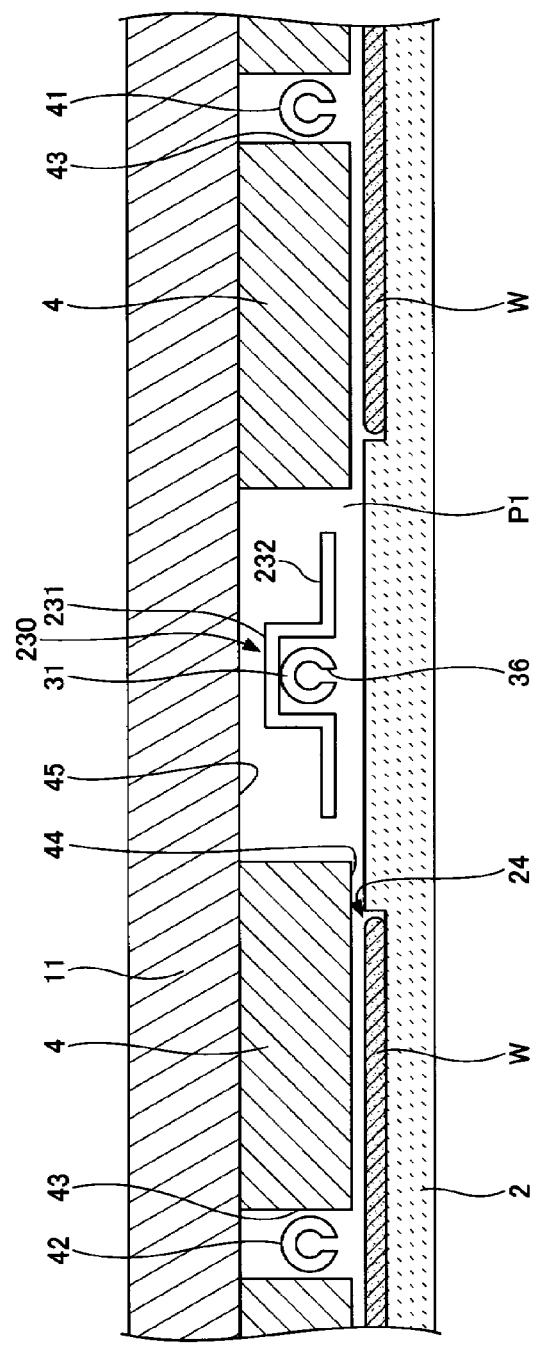
FIG. 3 is a cross-sectional view of a rotary table of the plasma processing apparatus of FIG. 1 along a concentric circle.

FIG. 3 is a cross-sectional view of the rotary table 2 of the plasma processing apparatus of FIG. 1 along a concentric circle, and is a cross-sectional view from a separation area D to another separation area D through the first processing area P1.

A substantially fan-shaped convex 4 is provided on the ceiling plate 11 of the vacuum container 1 in the separation area D. The convex 4 is attached to the back surface of the ceiling plate 11. In the vacuum container 1, there exist a flat and low ceiling surface which is the lower surface of the convex 4 (hereinafter, referred to as a "first ceiling surface 44"), and a ceiling surface which is positioned at the circumferentially opposite sides of the first ceiling surface 44 and is higher than the first ceiling surface 44 (hereinafter, referred to as a "second ceiling surface 45").

As illustrated in FIG. 2, the convex 4 that forms the first ceiling surface 44 has a planar fan shape cut in an arc shape at the top portion thereof. A groove 43 is formed in the convex 4 to extend radially from the center of the convex 4 in the circumferential direction thereof. Each of the separation gas nozzles 41 and 42 is accommodated in the groove 43. Further, the peripheral edge of the convex 4 (the portion close to the outer edge of the vacuum container 1) is bent in an L shape to be slightly spaced apart from the container body 12 while facing the outer end surface of the rotary table 2, in order to suppress the respective processing gases from being mixed with each other.

A nozzle cover 230 is provided above the first processing gas nozzle 31 to cause the first processing gas to flow along the wafer W and to cause the separation gas to flow nearby the ceiling plate of the vacuum container 1 while avoiding the vicinity of the wafer W. As illustrated in FIG. 3, the nozzle cover 230 includes a cover body 231 and straightening plates 232. The cover body 231 has a substantially box shape opened at the lower surface thereof to accommodate the first processing gas nozzle 31. The straightening plates 232 are plate-like bodies connected to the opening ends of the lower surface of the cover body 231 upstream and downstream in the rotation direction of the rotary table 2, respectively. The side wall surface of the cover body 231 close to the rotation center of the rotary table 2 extends toward the rotary table 2 while facing the tip end of the first processing gas nozzle 31. Further, the side wall surface of the cover body 231 close to the outer edge of the rotary table 2 is notched so as not to interfere with the first processing gas nozzle 31. The nozzle cover 230 may not necessarily be provided, and may be provided as needed.

As illustrated in FIG. 2, a plasma source 80 is provided above the plasma processing gas nozzles 33 to 35 to convert the plasma processing gas ejected into the vacuum container 1 into plasma. The plasma source 80 generates inductively coupled plasma using the antenna 83.

Figure 4:
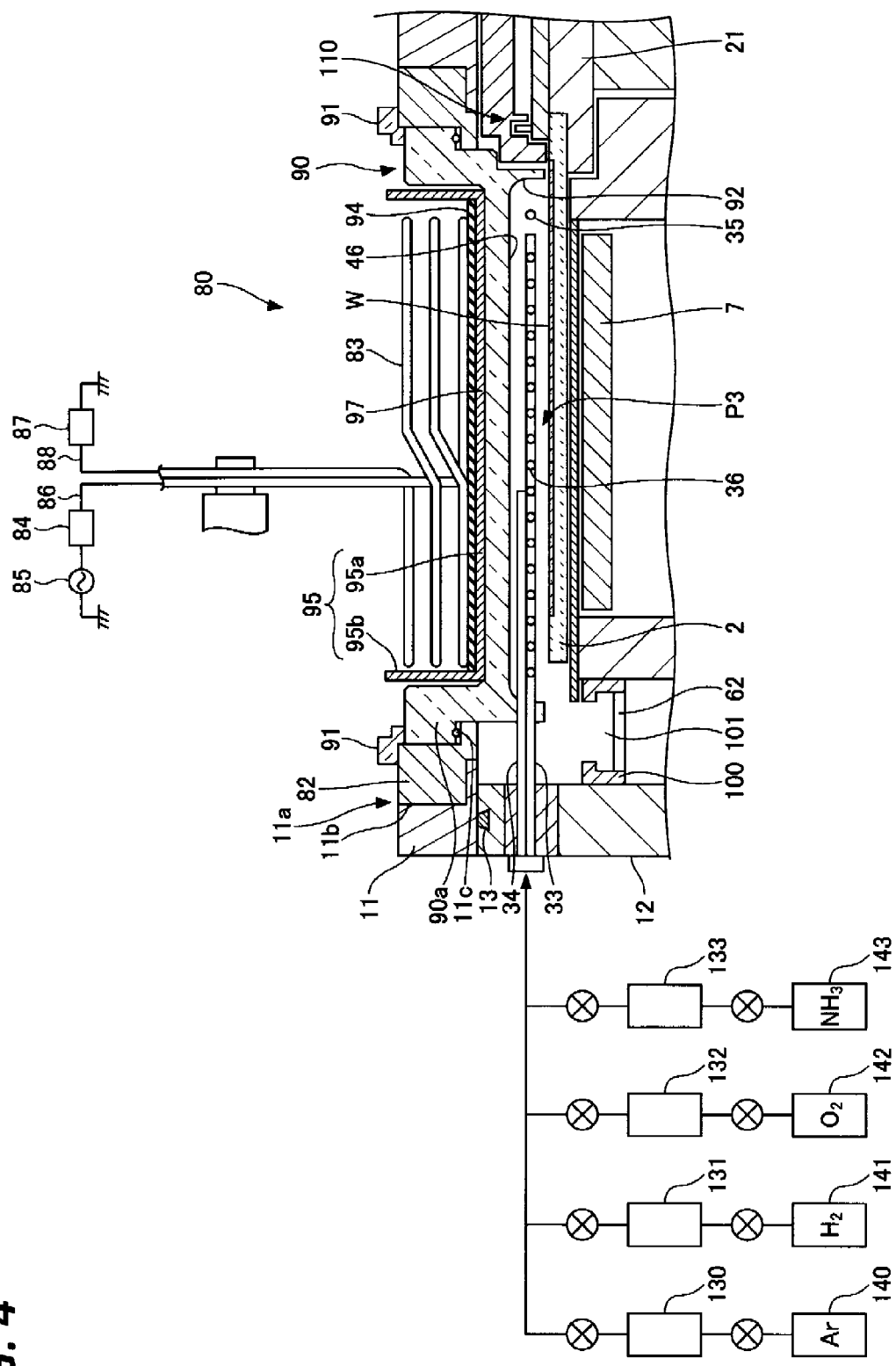
FIG. 4 is a cross-sectional view of a plasma source provided in the plasma processing apparatus of FIG. 1.
Figure 5:
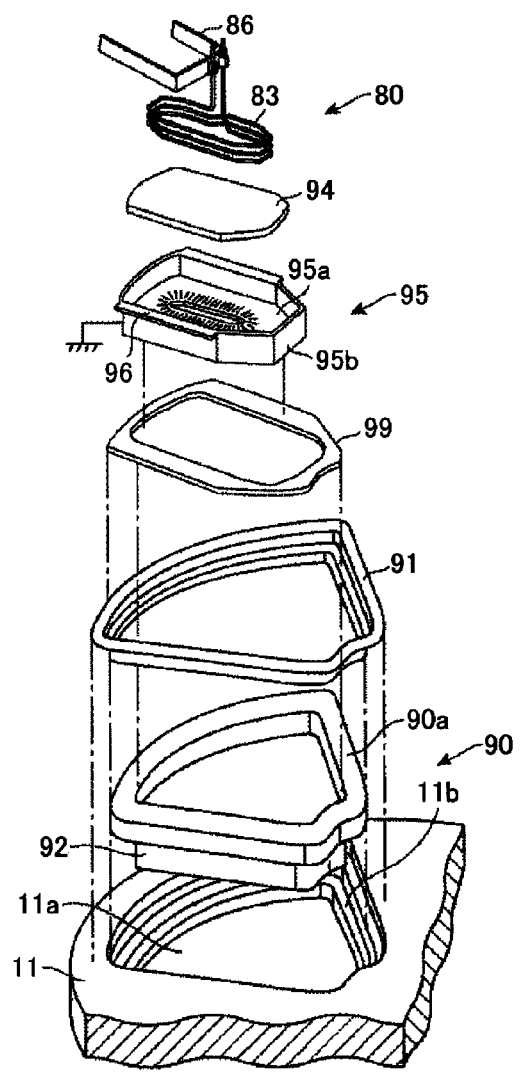
FIG. 5 is an exploded perspective view of the plasma source provided in the plasma processing apparatus of FIG. 1.
Figure 6:
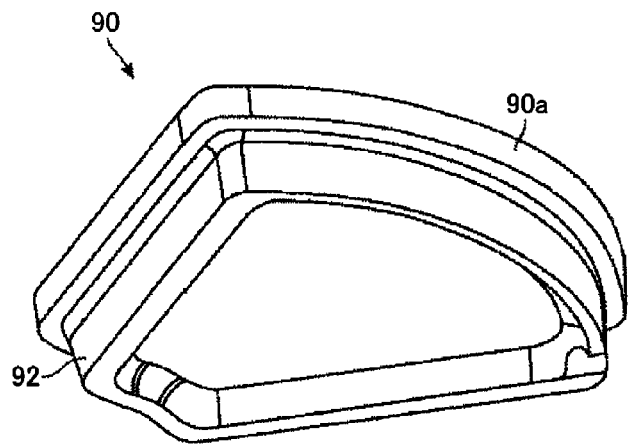
FIG. 6 is a perspective view of an example of a housing provided in the plasma source of FIG. 5.

FIG. 4 is a cross-sectional view of the plasma source 80 provided in the plasma processing apparatus of FIG. 1. FIG. 5 is an exploded perspective view of the plasma source 80 provided in the plasma processing apparatus of FIG. 1. FIG. 6 is a perspective view of an example of a housing 90 provided in the plasma source 80 of FIG. 5.

The plasma source 80 is configured by winding the antenna 83 formed of a metal wire or the like in a coil shape, for example, three times around the vertical axis. The plasma source 80 is disposed to surround a strip-shaped area that extends in the diameter direction of the rotary table 2 and to extend over the diameter portion of the wafer W on the rotary table 2, in the plan view.

One end of the antenna 83 is connected to an RF power supply 85 via a matching unit 84, and the other end thereof is grounded via a variable capacitor 87. The antenna 83 is provided to be airtightly partitioned from the internal area of the vacuum container 1. One end of the antenna 83, the matching unit 84, and the RF power supply 85 are electrically connected to each other by a connection electrode 86, and the other end of the antenna 83 and the variable capacitor 87 are electrically connected to each other by a connection electrode 88. The RF power supply 85 supplies an RF power with variable frequency and power to the antenna 83.

The antenna 83 may have a vertically bendable configuration, and may be provided with a vertical movement mechanism capable of automatically bending the antenna 83 vertically, and a mechanism capable of vertically moving a position of the antenna 83 close to the center of the rotary table 2, as needed. FIG. 4 omits these components.

As illustrated in FIGS. 4 and 5, an opening 11a is formed in the ceiling plate 11 above the plasma processing gas nozzles 33 to 35, to be opened in a substantially fan shape in the plan view.

As illustrated in FIG. 4, in the opening 11a, an annular member 82 is provided airtightly to the opening 11a along the opening edge of the opening 11a. The housing 90 (to be described later) is provided airtightly to the inner peripheral surface of the annular member 82. That is, the annular member 82 is airtightly provided in the manner that the outer periphery of the annular member 82 is in contact with the inner peripheral surface 11b of the opening 11a of the ceiling plate 11, and the inner periphery of the annular member 82 is in contact with a flange 90a of the housing 90 (to be described later). Then, in order to dispose the antenna 83 below the ceiling plate 11, the housing 90 configured by a derivative such as quartz is provided in the opening 11a via the annular member 82. The bottom surface of the housing 90 serves as the ceiling surface 46 of the plasma processing area P3.

As illustrated in FIG. 6, the upper peripheral edge of the housing 90 extends circumferentially and horizontally in a flange shape to form the flange 90a, and in the plan view, the center of the housing 90 is recessed toward the internal area of the vacuum container 1 below the housing 90.

When the wafer W is placed below the housing 90, the housing 90 is disposed to extend over the diameter portion of the wafer W in the diameter direction of the rotary table 2. A seal member 11c such as an O-ring is provided between the annular member 82 and the ceiling plate 11 (see, e.g., FIG. 4).

The internal atmosphere of the vacuum container 1 is set to be airtight via the annular member 82 and the housing 90. Specifically, the annular member 82 and the housing 90 are fitted into the opening 11a, and then, the housing 90 is pressed circumferentially downward by a pressing member 91 formed in a frame shape along the contact portions of the annular member 82 and the housing 90 which are the upper surfaces of the annular member 82 and the housing 90. Further, the pressing member 91 is fixed to the ceiling plate 11 by bolts (not illustrated) or the like. As a result, the internal atmosphere of the vacuum container 1 is set to be airtight. For the simplification of illustration, FIG. 5 omits the annular member 82.

As illustrated in FIG. 6, a protrusion 92 is formed on the lower surface of the housing 90 to extend vertically toward the rotary table 2, so as to circumferentially surround the plasma processing area P3 below the housing 90. Then, the plasma processing gas nozzles 33 to 35 described above are accommodated in the area surrounded by the inner peripheral surface of the protrusion 92, the lower surface of the housing 90, and the upper surface of the rotary table 2. The protrusion 92 close to the base ends of the plasma processing gas nozzles 33 to 35 (close to the inner wall of the vacuum container 1) is notched in a substantially arc shape along the outer appearance of the plasma processing gas nozzles 33 to 35.

As illustrated in FIG. 4, the protrusion 92 is formed circumferentially below the housing 90 (in the plasma processing area P3). The seal member 11c is not directly exposed to plasma due to the protrusion 92, that is, is isolated from the plasma processing area P3. Thus, even when plasma diffuses from the plasma processing area P3 toward, for example, the seal member 11c, the plasma needs to flow below the protrusion 92, and hence, is deactivated before reaching the seal member 11c.

As illustrated in FIG. 4, the plasma processing gas nozzles 33 to 35 are provided in the third processing area P3 below the housing 90, and connected to an argon gas supply source 140, a hydrogen gas supply source 141, an oxygen gas supply source 142, and an ammonia gas supply source 143. Both of the hydrogen gas supply source 141 and the ammonia gas supply source 143 may not necessarily be provided, and either one of the hydrogen gas supply source 141 and the ammonia gas supply source 143 may be provided.

Flow rate controllers 130 to 133 are provided between the plasma processing gas nozzles 33 to 35 and the argon gas supply source 140/the hydrogen gas supply source 141/the oxygen gas supply source 142/the ammonia gas supply source 143, respectively. The argon gas supply source 140, the hydrogen gas supply source 141, the oxygen gas supply source 142, and the ammonia gas supply source 143 supply Ar gas, $H_2$ gas, $O_2$ gas, and $NH_3$ gas, respectively, to the plasma processing gas nozzles 33 to 35. The flow rates of Ar gas, $H_2$ gas, $O_2$ gas, and $NH_3$ gas are controlled by the flow rate controllers 130 to 133, respectively, such that the gases are supplied to the plasma processing gas nozzles 33 to 35 at a predetermined flow rate ratio (a mixing ratio). As described above, when either one of the hydrogen gas supply source 141 and the ammonia gas supply source 143 is provided, the flow rate controllers 131 and 133 are also selectively provided to correspond to either one of the hydrogen gas supply source 141 and the ammonia gas supply source 143. As for the flow rate controllers 130 to 133, for example, a mass flow controller may be used.

Further, in a case where a single plasma processing gas nozzle is provided, for example, a mixed gas of Ar gas, $H_2$ gas, $NH_3$ gas, and $O_2$ gas described above is supplied to the single plasma processing gas nozzle.

Figure 7:
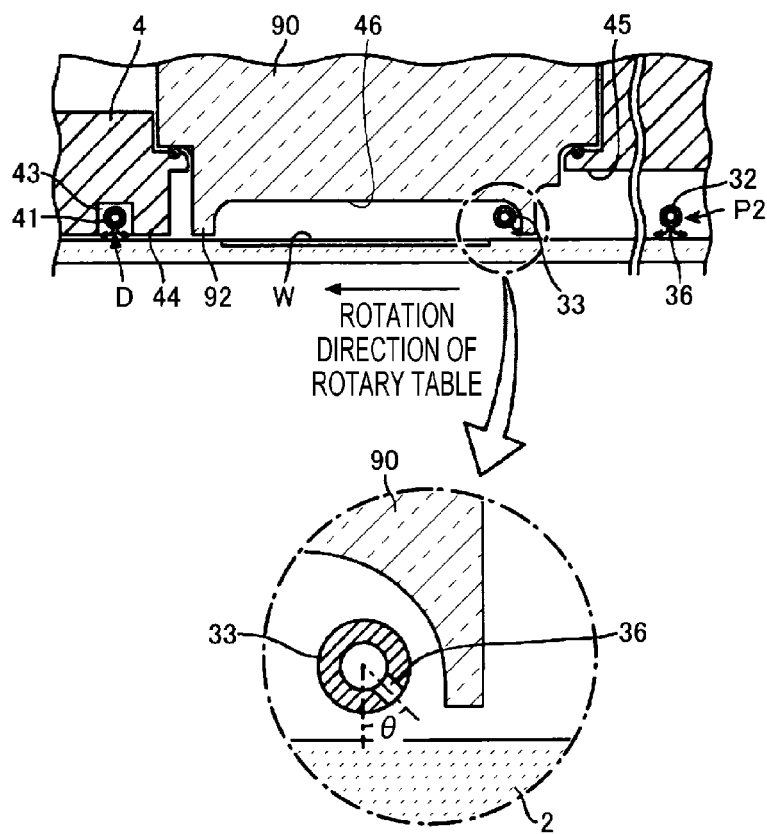
FIG. 7 is a separate cross-sectional view of the plasma source provided in the plasma processing apparatus of FIG. 1.

FIG. 7 is a separate cross-sectional view of the plasma source 80 provided in the plasma processing apparatus of FIG. 1, and represents a vertical cross-sectional view of the vacuum container 1 cut along the rotation direction of the rotary table 2. As illustrated in FIG. 7, since the rotary table 2 rotates clockwise during a plasma processing, the Ar gas may invade into the space below the housing 90 from the gap between the rotary table 2 and the protrusion 92 due to the rotation of the rotary table 2. Thus, in order to suppress the invasion of Ar gas into the space below the housing 90 through the gap, a gas is ejected from the space below the housing 90 toward the gap. Specifically, as illustrated in FIGS. 4 and 7, the gas ejection holes 36 of the plasma processing gas nozzle 33 are arranged toward the gap, that is, arranged to face upstream in the rotation direction of the rotary table 2 and downward. The facing angle θ of the gas ejection holes 36 of the plasma processing gas nozzle 33 with respect to the vertical axis may be, for example, about 45° as illustrated in FIG. 7, or about 90° to face the inner surface of the protrusion 92. That is, the facing angle θ of the gas ejection holes 36 may be set within a range of about 45° to about 90° that may appropriately suppress the invasion of Ar gas, according to an application.

Figure 8:
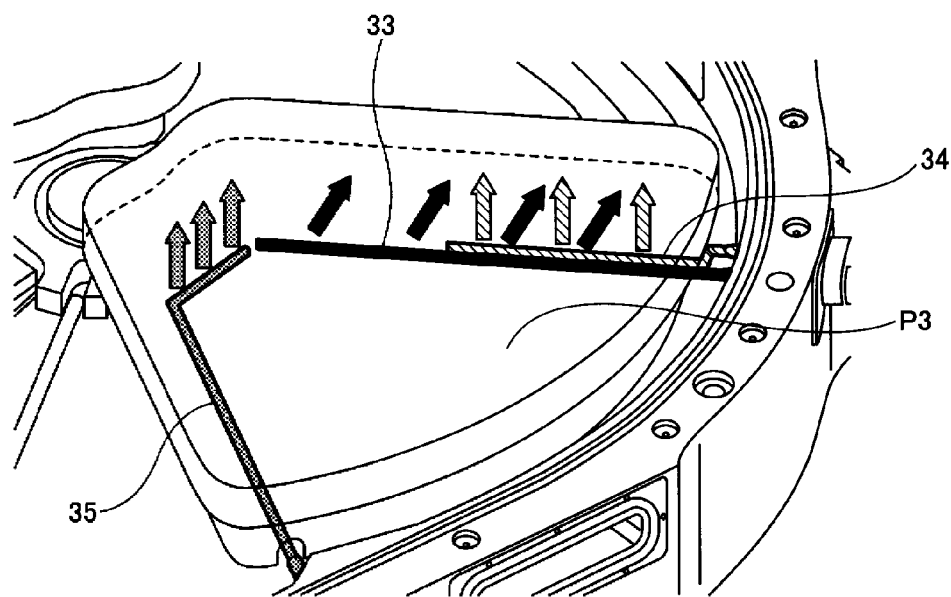
FIG. 8 is an enlarged perspective view of a plasma processing gas nozzle provided in a plasma processing area.

FIG. 8 is an enlarged perspective view of the plasma processing gas nozzles 33 to 35 provided in the plasma processing area P3. As illustrated in FIG. 8, the plasma processing gas nozzle 33 is a nozzle that may cover the entire recess 24 in which the wafer W is placed, and thus, is able to supply the plasma processing gas to the entire surface of the wafer W. Meanwhile, the plasma processing gas nozzle 34 is a nozzle that is provided slightly above the plasma processing gas nozzle 33 to substantially overlap with the plasma processing gas nozzle 33, and has the length that corresponds to about half of the length of the plasma processing gas nozzle 33. The plasma processing gas nozzle 35 has a shape that extends from the outer peripheral wall of the vacuum container 1 along the radius of the fan-shaped plasma processing area P3 downstream in the rotation direction of the rotary table 2, and is linearly bent along the central area C when reaching the vicinity of the central area C. Hereinafter, for the easy discrimination, the plasma processing gas nozzle 33 that covers the entire portion will also be referred to as a base nozzle 33, the plasma processing gas nozzle 34 that covers only the outer portion will also be referred to as an outer nozzle 34, and the plasma processing gas nozzle 35 that extends inside will also be referred to as a shaft-side nozzle 35.

The base nozzle 33 is a gas nozzle for supplying the plasma processing gas to the entire surface of the wafer W, and ejects the plasma processing gas toward the protrusion 92 that serves as the side surface that partitions the plasma processing area P3 as described above with reference to FIG. 7.

Meanwhile, the outer nozzle 34 is a nozzle for intensively supplying the plasma processing gas to the outer area of the wafer W.

The shaft-side nozzle 35 is a nozzle for intensively supplying the plasma processing gas to the central area of the wafer W close to the shaft of the rotary table 2.

When a single plasma processing gas nozzle is provided, the base nozzle 33 may be provided alone.

Next, a Faraday shield 95 of the plasma source 80 will be described in detail. As illustrated in FIGS. 4 and 5, the grounded Faraday shield 95 is accommodated above the housing 90, and is configured by a metal plate such as, for example, copper which is a conductive plate-like body formed substantially along the internal shape of the housing 90. The Faraday shield 95 includes a horizontal plane 95a that is horizontally locked along the bottom surface of the housing 90, and a vertical plane 95b that extends circumferentially upward from the outer end of the horizontal plane 95a, and may be configured to be, for example, substantially hexagonal in the plan view.

Figure 9:
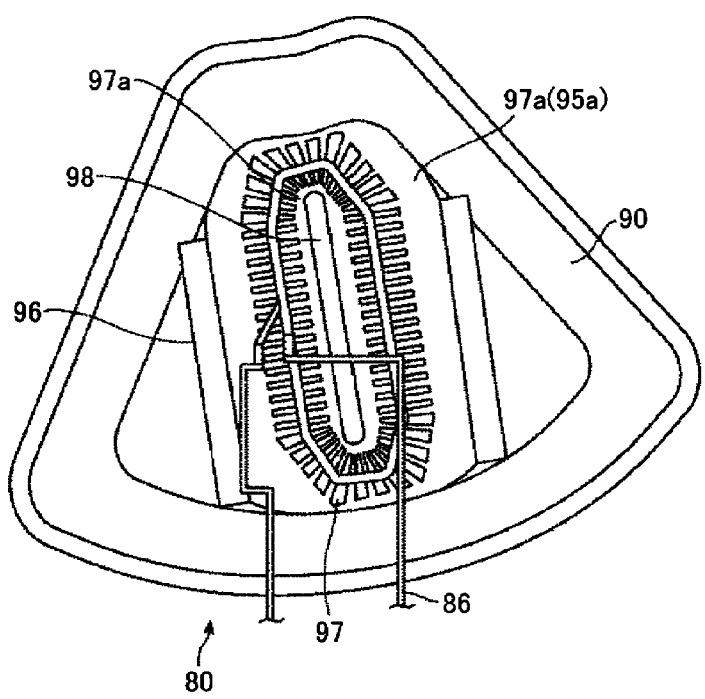
FIG. 9 is a plan view of an example of the plasma source of FIG. 5.
Figure 10:
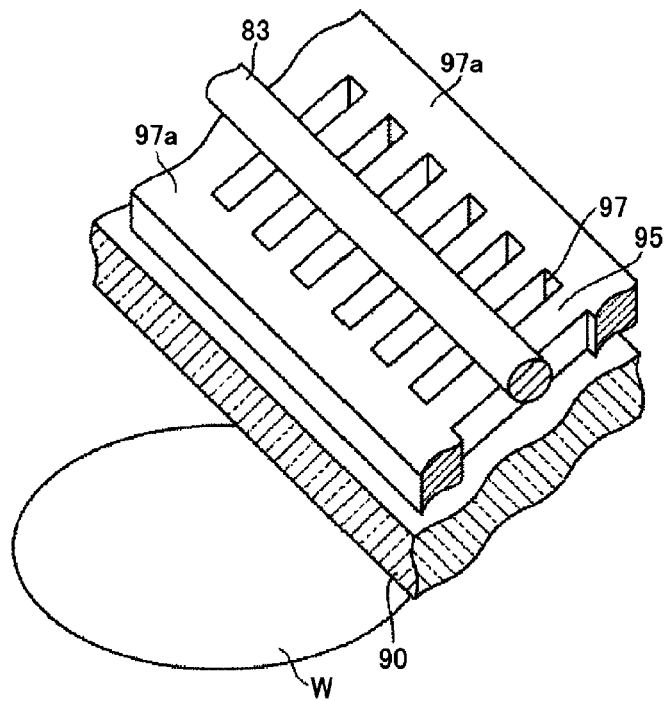
FIG. 10 is a perspective view illustrating a portion of a Faraday shield provided in the plasma source.

FIG. 9 is a plan view of an example of the plasma source 80 of FIG. 5, and illustrates an example of the plasma source 80 in which the details of the structure of the antenna 83 and the vertical movement mechanism are omitted. FIG. 10 is a perspective view illustrating a portion of the Faraday shield 95 provided in the plasma source 80.

When the Faraday shield 95 is viewed from the rotation center of the rotary table 2, the right and left upper end edges of the Faraday shield 95 extend horizontally rightward and leftward, respectively, so as to form supports 96. A frame-shape body 99 is provided between the Faraday shield 95 and the housing 90, to support the supports 96 from below and to be supported by the flange 90a close to the central area C of the housing 90 and the outer edge of the rotary table 2 (see, e.g., FIG. 5).

When an electric field reaches the wafer W, electric wires or the like formed inside the wafer W may be electrically damaged. Thus, as illustrated in FIG. 10, a plurality of slits 97 is formed in the horizontal plane 95a to suppress the electric field component of the electric field and the magnetic field (the electromagnetic field) generated from the antenna 83 from being directed toward the wafer W placed below, and to cause the magnetic field to reach the wafer W.

As illustrated in FIGS. 9 and 10, the slits 97 are formed circumferentially below the antenna 83 to extend in a direction orthogonal to the winding direction of the antenna 83. The slits 97 are formed to each have a width dimension of about 1/10,000 or less of the wavelength that corresponds to the frequency of the RF power supplied to the antenna 83. Further, conductive paths 97a formed of a grounded conductor or the like are arranged circumferentially close to one end and the other end of each slit 97 in the length direction thereof. An opening 98 is formed in the area of the Faraday shield 95 outside the area where the slits 97 are formed, that is, in the center of the area where the antenna 83 is wound, to check the light emitting state of plasma through the area.

As illustrated in FIG. 5, an insulating plate 94 made of quartz or the like with the thickness dimension of, for example, about 2 mm is stacked on the horizontal plane 95a of the Faraday shield 95 to secure the insulation from the plasma source 80 disposed above the Faraday shield 95. That is, the plasma source 80 is disposed to cover the inside of the vacuum container 1 (the wafer W placed on the rotary table 2) via the housing 90, the Faraday shield 95, and the insulating plate 94.

The rest components of the plasma processing apparatus of the embodiment will be described.

As illustrated in FIGS. 1 and 2, a side ring 100 which is a cover body is disposed close to the outer periphery of the rotary table 2 at a position below the rotary table 2. A first exhaust port 61 and a second exhaust port 62 are formed in the upper surface of the side ring 100 to be spaced circumferentially apart from each other. In other words, two exhaust ports are formed in the bottom surface of the vacuum container 1, and the first exhaust port 61 and the second exhaust port 62 are formed at the positions of the side ring 100 that correspond to the exhaust ports of the bottom surface of the vacuum container 1.

The first exhaust port 61 is formed between the first processing gas nozzle 31 and the separation area D positioned downstream from the first processing gas nozzle 31 in the rotation direction of the rotary table 2, at a position close to the separation area D. The second exhaust port 62 is formed between the plasma source 80 and the separation area D positioned downstream from the plasma source 80 in the rotation direction of the rotary table 2, at a position close to the separation area D.

The first exhaust port 61 exhausts the first processing gas or the separation gas, and the second exhaust port 62 exhausts the plasma processing gas or the separation gas. As illustrated in FIG. 1, each of the first exhaust port 61 and the second exhaust port 62 is connected to, for example, a vacuum pump 64 which is a vacuum exhaust mechanism, via an exhaust pipe 63 provided with a pressure regulator 65 such as a butterfly valve.

As described above, since the housing 90 is disposed from the central area C to the outer edge, the flow of the gas that flows from upstream in the rotation direction of the rotary table 2 with respect to the second processing area P2 toward the second exhaust port 62 may be restricted by the housing 90. Thus, a groove-shaped gas flow path 101 is formed in the upper surface of the side ring 100 outside the outer periphery of the housing 90, to allow the gas to flow therethrough.

As illustrated in FIG. 1, a protrusion 5 is provided at the center of the lower surface of the ceiling plate 11, circumferentially in a substantially annular shape to be continuous with the portion of the convex 4 close to the central area C, such that the lower surface of the protrusion 5 is flush with the lower surface of the convex 4 (the first ceiling surface 44). A labyrinth structure 110 is disposed above the core 21 closer to the rotation center of the rotary table 2 than the protrusion 5, to suppress the various gases from being mixed with each other in the central area C.

As described above, since the housing 90 is formed to reach the vicinity of central area C, the core 21 that supports the center of the rotary table 2 is formed close to the rotation center such that the portion above the rotary table 2 avoids the housing 90. Thus, the various gases may be easily mixed with each other in the central area C, rather than the outer edge. Thus, when the labyrinth structure 110 is formed above the core 21, a gas flow path may be obtained, so that the various gases may be suppressed from being mixed with each other.

As illustrated in FIG. 1, a heater 7 which is a heating mechanism is provided in the space between the rotary table 2 and the bottom 14 of the vacuum container 1. The heater 7 is configured to be able to heat the wafer W on the rotary table 2 through the rotary table 2 to a temperature of, for example, room temperature to about 700° C. In FIG. 1, a cover member 71 is provided beside the heater 7, and a shield member 7a is provided to shield the heater 7 above the heater 7. Further, at the bottom 14 of the vacuum container 1, purge gas supply pipes 73 are provided circumferentially at a plurality of positions below the heater 7, to purge the space where the heater 7 is disposed.

As illustrated in FIG. 2, a transfer port 15 is formed in the side wall of the vacuum container 1 to transfer the wafer W between a transfer arm 10 and the rotary table 2. The transfer port 15 is configured to be airtightly openable and closable from a gate valve G.

The wafer W in the recess 24 of the rotary table 2 is transferred with respect to the transfer arm 10 at the position that faces the transfer port 15. Thus, lifting pins and a lifting mechanism (not illustrated) are provided at the position that corresponds to the exchange position below the rotary table 2, to lift the wafer W from the back surface thereof through the recess 24.

Further, the plasma processing apparatus of the embodiment is provided with a controller 120 that includes a computer for controlling the entire operation of the apparatus. A program for performing a substrate processing (to be described later) is stored in a memory of the controller 120. The program is organized with a group of steps for executing the various operations of the apparatus, and installed into the controller 120 from the storage 121 which is a storage medium such as a hard disk, a compact disk, a magneto-optical disk, a memory card or a flexible disk.

[Plasma Source]

Figure 11:
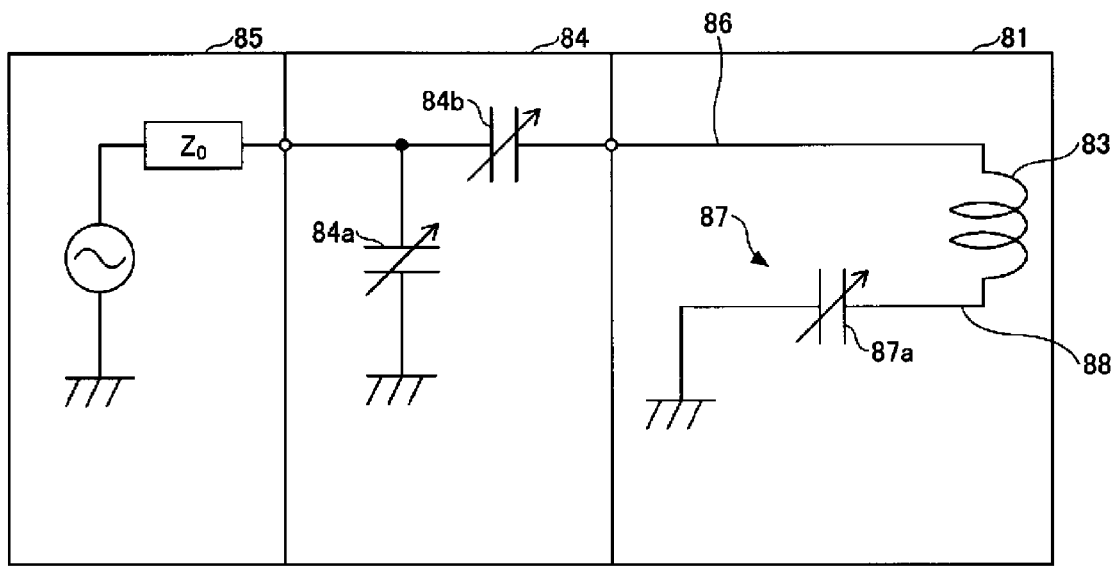
FIG. 11 is a view illustrating an example of a circuit configuration of the plasma source.

The plasma source 80 used in the plasma processing apparatus of FIG. 1 will be described with reference to FIG. 11. FIG. 11 is a view illustrating an example of a circuit configuration of the plasma source 80.

The plasma source 80 includes an RF power supply 85, a matching unit 84, and a load 81.

The RF power supply 85 supplies an RF power to the load 81. The RF power supply 85 is configured to be able to change the power and the frequency of the RF power based on the control from the controller 120. For example, the RF power supply 85 operates such that the frequency of the RF power when plasma is ignited in the plasma processing area P3 becomes smaller than the frequency of the RF power when a film is formed on the wafer W after the plasma is ignited, based on the control from the controller 120. The variable range of the frequency of the RF power is, for example, the range of the frequency band of the Industry Science and Medical (ISM) band.

The matching unit 84 is interposed between the RF power supply 85 and the load 81. The matching unit 84 operates to match the impedances between the RF power supply 85 and the load 81, and efficiently transmit the RF power output from the RF power supply 85 to the load 81 with no reflection or less reflection. The matching unit 84 is a matching unit 84 of an inverted L-shaped circuit that includes a variable capacitance condenser 84a and a variable capacitance condenser 84b. The variable capacitance condenser 84a is connected in series between an output terminal of the RF power supply 85 and the ground potential. The variable capacitance condenser 84b is connected in series between the RF power supply 85 and the load 81. The variable capacitance condensers 84a and 84b make up an inductively coupled matching circuit. The matching unit 84 includes an auto-matching mechanism that changes the capacitances of the variable capacitance condensers 84a and 84b based on the control from the controller 120.

The load 81 includes the antenna 83 and the variable capacitor 87.

One end of the antenna 83 is connected to the RF power supply 85 via the matching unit 84, and when the RF power is supplied from the RF power supply 85, the antenna 83 functions as an inductively coupled plasma (ICP) antenna. One end of the antenna 83, the matching unit 84, and the RF power supply 85 are electrically connected to each other by the connection electrode 86.

The variable capacitor 87 includes a variable capacitance condenser 87a. The variable capacitance condenser 87a is connected in series to the antenna 83. That is, one end of the variable capacitance condenser 87a is connected to the other end of the antenna 83, and the other end thereof is grounded. The variable capacitance condenser 87a is configured to be able to change the capacitance based on the control from the controller 120. One end of the variable capacitance condenser 87a and the other end of the antenna 83 are electrically connected to each other by the connection electrode 88. The impedance Zc of the variable capacitor 87 is represented by the following equation (1) using the capacitance C of the variable capacitor 87 and the frequency "f" of the RF power output by the RF power supply 85.

$$Z_C = \frac{1}{j2\pi fC} = -j\frac{1}{2\pi fC} \qquad (1)$$

Since the variable capacitor 87 includes one variable capacitance condenser 87a, the capacitance C of the variable capacitor 87 is the same as the capacitance $C_0$ of the variable capacitance condenser 87a, and meets the relationship of the following equation (2).

$$C = C_0 \qquad (2)$$

Thus, by controlling the capacitance $C_0$ of the variable capacitance condenser 87a, the impedance Zc of the variable capacitor 87 may be adjusted, so that the amplitude potential of the antenna 83 with respect to the potential of the ground (GND) may be adjusted. For example, when the capacitance $C_0$ of the variable capacitance condenser 87a is adjusted to be relatively small, the impedance Zc of the variable capacitor 87 increases, so that the amplitude potential of the antenna 83 with respect to the potential of the GND increases. Meanwhile, when the capacitance $C_0$ of the variable capacitance condenser 87a is adjusted to be relatively large, the impedance Zc of the variable capacitor 87 decreases, so that the amplitude potential of the antenna 83 with respect to the potential of the GND decreases. The variable capacitance condenser 87a is also called a variable condenser or a vari-con.

As described above, according to the plasma source 80 illustrated in FIG. 11, the other end of the antenna 83 is grounded via the variable capacitor 87 (the variable capacitance condenser 87a). As a result, the impedance Zc of the variable capacitor 87 may be increased by reducing the capacitance $C_0$ of the variable capacitance condenser 87a when plasma is ignited. Thus, the amplitude potential of the antenna 83 with respect to the GND increases. As a result, plasma may easily be ignited. That is, plasma may be ignited with the relatively low power. Further, the potential between adjacent turns of the antenna 83 may be lowered, so that the occurrence of an abnormal discharge between turns may be reduced.

Figure 12:
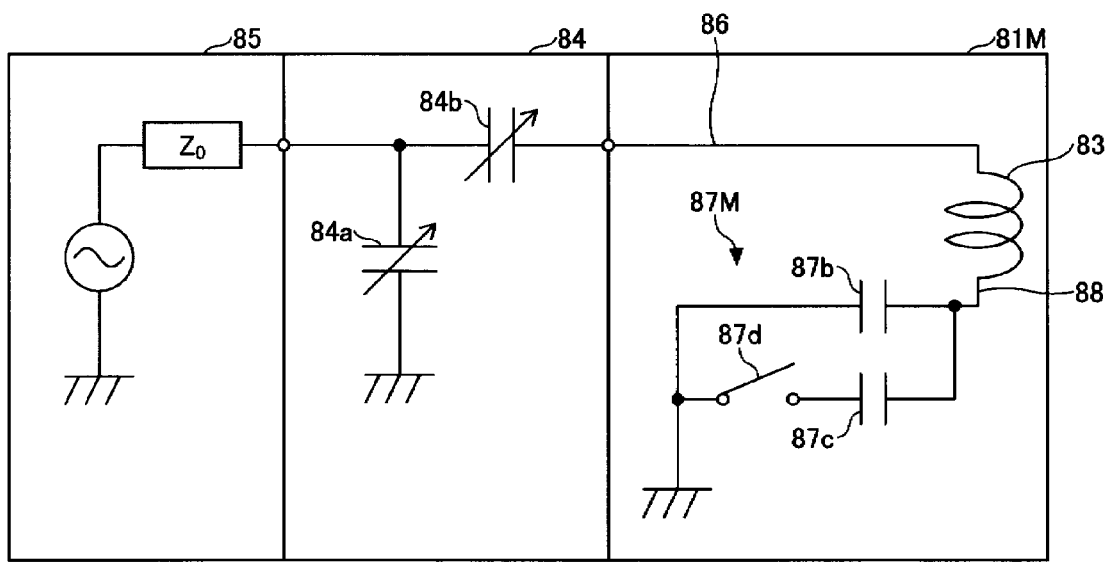
FIG. 12 is a view illustrating another example of the circuit configuration of the plasma source.

Another plasma source 80M used in the plasma processing apparatus of FIG. 1 will be described with reference to FIG. 12. FIG. 12 is a view illustrating another example of a circuit configuration of the plasma source 80M.

In the plasma source 80M illustrated in FIG. 12, two fixed capacitance condensers 87b and 87c connected in parallel to each other are provided, instead of the variable capacitance condenser 87a of the plasma source 80 illustrated in FIG. 11, and a switch 87d is connected in series to the fixed capacitance condenser 87c. Since the rest configuration of the plasma source 80M is the same as that of the plasma source 80 illustrated in FIG. 11, differences from the plasma source 80 illustrated in FIG. 11 will be mainly described below.

The plasma source 80M includes the RF power source 85, the matching unit 84, and a load 81M.

The load 81M includes the antenna 83 and a variable capacitor 87M. The variable capacitor 87M includes the fixed capacitance condensers 87b and 87c, and the switch 87d.

The fixed capacitance condenser 87b is a condenser having a fixed capacitance. One end of the fixed capacitance condenser 87b is connected to the other end of the antenna 83, and the other end thereof is grounded.

The fixed capacitance condenser 87c is a condenser having a fixed capacitance. The fixed capacitance condenser 87c is connected in parallel to the fixed capacitance condenser 87b. One end of the fixed capacitance condenser 87c is connected to the other end of the antenna 83, and the other end thereof is grounded via the switch 87d.

The switch 87d is connected to the other end of the fixed capacitance condenser 87c. The "ON" and "OFF" of the switch 87d are switched based on the control from the controller 120. By switching the "ON" and "OFF" of the switch 87d, the connection state between the other end of the antenna 83 and the GND may be switched. As a result, the impedance Zc of the variable capacitor 87M is adjusted. The impedance Zc of the variable capacitor 87M is represented by the following equation (3) using the capacitance C of the variable capacitor 87M and the frequency "f" of the RF power output by the RF power supply 85.

$$Z_C = \frac{1}{j2\pi fC} = -j\frac{1}{2\pi fC} \quad (3)$$

Further, the variable capacitor 87M includes the fixed capacitance condensers 87b and 87c connected in parallel to each other. Thus, the capacitance C of the variable capacitor 87M becomes the combined capacitance of the capacitance $C_1$ of the fixed capacitance condenser 87b and the capacitance $C_2$ of the fixed capacitance condenser 87c, and meets the relationship of the following equation (4).

$$C = C_1 + C_2 \quad (4)$$

Thus, by switching the "ON" and "OFF" of the switch 87d, the impedance Zc of the variable capacitor 87M may be adjusted, so that the amplitude potential of the antenna 83 with respect to the potential of the GND may be adjusted. For example, when the switch 87d is "OFF," the other end of the antenna 83 is grounded via the fixed capacitance condenser 87b. As a result, the capacitance C of the variable capacitor 87M becomes small, and the impedance Zc of the variable capacitor 87M increases, so that the amplitude potential of the antenna 83 with respect to the potential of the GND increases. Meanwhile, when the switch 87d is "ON," the other end of the antenna 83 is grounded via the fixed capacitance condensers 87b and 87c connected in parallel to each other. As a result, the capacitance C of the variable capacitor 87M becomes large, and the impedance Zc of the variable capacitor 87M decreases, so that the amplitude potential of the antenna 83 with respect to the potential of the GND decreases.

As described above, according to the plasma source 80M illustrated in FIG. 12, the other end of the antenna 83 is grounded via the variable capacitor 87M (the variable capacitance condensers 87b and 87c, and the switch 87d). As a result, by turning the switch 87d "OFF" when plasma is ignited to reduce the capacitance of the variable capacitor 87M, the impedance Zc of the variable capacitor 87M may be increased. Thus, the amplitude potential of the antenna 83 with respect to the GND increases. As a result, plasma may be easily be ignited. That is, plasma may be ignited with the relatively low power. Further, the potential between adjacent turns of the antenna 83 may be lowered, so that the occurrence of an abnormal discharge between turns may be reduced.

While the circuit configurations of the plasma sources 80 and 80M have been described with reference to FIGS. 11 and 12, the circuit configurations of the plasma sources 80 and 80M are not limited to the examples described above. For example, the circuit configurations of the plasma sources 80 and 80M illustrated in FIGS. 11 and 12 may be combined with each other. Specifically, the variable capacitor may have a configuration in which one or two or more variable capacitance condensers and one or two or more fixed capacitance condensers are connected in parallel to each other.

Meanwhile, in order to improve the ignitability of plasma, the number of turns of the antenna 83 may be increased or the frequency of the RF power applied to the antenna 83 may be increased, for enhancing the electromagnetic field. However, in this case, since a matching unit having a broad matching range is required, the matching unit of the inverted L-shaped circuit requires a relatively large variable capacitance condenser as an internal variable capacitance condenser, which is not preferable in terms of mounting and costs.

Meanwhile, in the plasma sources 80 and 80M of the embodiment, since the variable capacitors 87 and 87M are added in series to the antenna 83, a matching unit having a relatively narrow matching range may be used.

[Plasma Processing Method]

Figure 13:
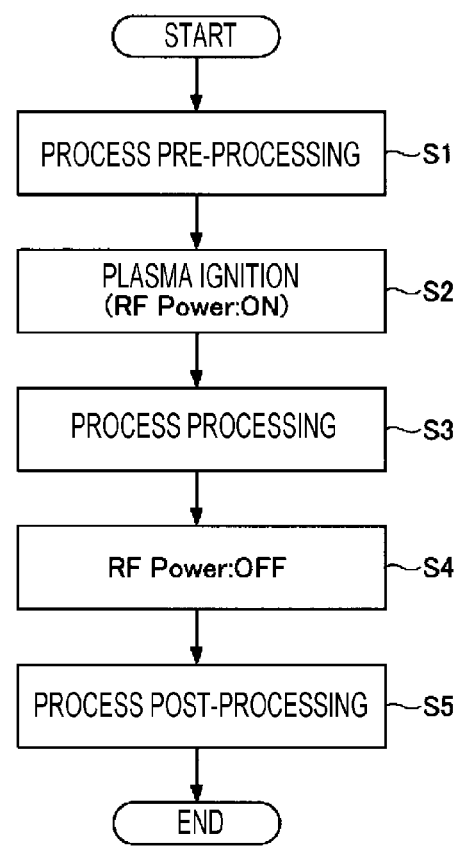
FIG. 13 is a flowchart of an example of a plasma processing method according to an embodiment.

A plasma processing method of an embodiment will be described with reference to FIG. 13, using an example where a thin film is formed by using the foregoing plasma processing apparatus. Examples of the thin film that may be formed by the plasma processing method of the embodiment include a oxide film such as $SiO_2$, $ZrO_2$, $HfO_2$, $TiO_2$, or $Al_2O_3$, a nitride film such as SiN, HfN, TiN, and AlN, or a combined film of the compounds such as ZrAlO, HfAlO, and HfSiON.

Hereinafter, descriptions will be made on a case where a thin film of $SiO_2$ is formed by using a silicon-containing gas as a raw material gas, ozone as an oxidizing gas, a mixed gas of argon, oxygen, and hydrogen as a plasma processing gas, and argon as a separation gas. FIG. 13 is a flowchart illustrating an example of the plasma processing method of the embodiment.

First, the wafer W is carried into the vacuum container 1. When the wafer W is carried into the vacuum container 1, the gate valve G is opened, and the rotary table 2 is intermittently rotated, such that the wafer W is placed on the rotary table 2 by the transfer arm 10 through the transfer port 15. After the wafer W is placed, the transfer arm 10 is retracted to the outside of the vacuum container 1, and the gate valve G is closed.

Subsequently, a process pre-processing is performed (step S1). In the process pre-processing, the wafer W is heated by the heater 7 to a predetermined temperature while rotating the rotary table 2, in a state where the inside of the vacuum container 1 is controlled by the vacuum pump 64 and the pressure regulator 65 to a predetermined pressure, for example, 1 Torr (133 Pa) or more. At this time, Ar gas is supplied as the separation gas from the separation gas nozzles 41 and 42. Further, a silicon-containing gas is supplied from the first processing gas nozzle 31, ozone is supplied from the second processing gas nozzle 32, and the plasma processing gas that includes a mixed gas of argon, oxygen, and hydrogen is supplied from the plasma processing gas nozzles 33 to 35 at a predetermined flow rate. The controller 120 performs the series of controls.

Subsequently, plasma is ignited (step S2). Specifically, the parameters of the plasma sources 80 and 80M are set to a plasma ignition condition, and the RF power is supplied from the RF power supply 85 to the antenna 83, such that plasma is ignited and generated. The plasma ignition condition is a condition that the impedance Zc of the variable capacitors 87 and 87M is larger than a process processing condition (to be described later). For example, the controller 120 sets the frequency of the RF power (a first frequency) during the ignition of plasma to be lower than the frequency of the RF power (a second frequency) during the process processing. For example, when the frequency during the process processing is 13.56 MHz, the frequency of the RF power during the ignition of plasma may be 12.56 MHz. Further, for example, the controller 120 sets the capacitance of the variable capacitance condenser 87a (a first capacitance) during the ignition of plasma, to be smaller than the capacitance of the variable capacitance condenser 87a (a second capacitance) during the process processing. For example, when the capacitance of the variable capacitance condenser 87a during the process processing is 50 pF, the capacitance of the variable capacitance condenser 87a during the ignition of plasma may be 45 pF. Further, for example, the controller 120 sets the switch 87d to "ON" during the process processing, and sets the switch 87d to "OFF" during the ignition of plasma. In this way, by setting the impedance of the variable capacitors 87 and 87M during the ignition of plasma to be larger than the impedance of the variable capacitors 87 and 87M during the process processing, the amplitude potential of the antenna with respect to the GND may be increased. As a result, plasma may easily be ignited. That is, plasma may be ignited with the relatively low power.

Subsequently, the process processing is performed (step S3). In the process processing, the parameters of the plasma sources 80 and 80M are changed from the plasma ignition condition into a process processing condition, while supplying the RF power from the RF power supply 85 to the antenna 83. The process processing condition is a condition that the impedance of the variable capacitors 87 and 87M is smaller than the plasma ignition condition. In the process processing, the silicon-containing gas is adsorbed onto the surface of the wafer W in the first processing area P1 due to the rotation of the rotary table 2, and subsequently, the silicon-containing gas adsorbed onto the wafer W is oxidized by ozone in the second processing area P2. As a result, one or a plurality of molecular layers of SiO$_2$ which is a thin film component is formed and deposited on the wafer W. Further, when the rotary table 2 rotates, the wafer W reaches the plasma processing area P3, and the process of modifying the silicon oxide film is performed by the plasma processing. In the plasma processing area P3, the mixed gas of Ar/O$_2$/H$_2$ is supplied as a plasma processing gas from the base nozzle 33, the outer nozzle 34, and the shaft-side nozzle 35. Further, as needed, based on the supply from the base nozzle 33, the flow rate of oxygen may be lowered in the area close to the central shaft where the amount of the plasma processing tends to increase due to the slow angular velocity, so as to make the modifying force weaker than that of the mixed gas supplied from the base nozzle 33. Further, the flow rate of oxygen may be increased in the area close to the outer periphery where the amount of the plasma processing tends to be insufficient due to the fast angular velocity, so as to make the modifying force stronger than that of the mixed gas supplied from the base nozzle 33. As a result, the influence of the angular velocity of the rotary table 2 may be appropriately adjusted.

In this state, the rotation of the rotary table 2 is continued, such that the absorption of the silicon-containing gas onto the surface of the wafer W, the oxidization of the silicon-containing gas component absorbed onto the surface of the wafer W, and the plasma modification of the silicon oxide film which is a reaction product are performed in this order a plurality of times. That is, the film forming process according to the ALD method and the modifying process of the formed film are performed a plurality of times by the rotation of the rotary table 2.

Further, the separation areas D are disposed between the first processing area P1 and the second processing area P2 and between the third processing area P3 and the first processing area P1, in the plasma processing apparatus of the embodiment, along the circumferential direction of the rotary table 2. Thus, in the separation areas D, the mixing of the processing gas and the plasma processing gas is suppressed, and each gas is exhausted toward the first exhaust port 61 and the second exhaust port 62.

After the film forming process and the modifying process are repeated such that the silicon oxide film reaches a predetermined film thickness, the supply of the RF power from the RF power supply 85 to the antenna 83 is stopped (step S4). Further, the supply of the silicon-containing gas, the ozone gas, and the plasma processing gas is stopped.

Subsequently, a process post-processing is performed (step S5). In the process post-processing, for example, the gas, the pressure, and the temperature in the vacuum container 1 are set to a state for carrying out the processed wafer W, the rotation of the rotary table 2 is stopped, the processed wafer W is then carried out from the vacuum container 1, and the process is ended.

As described above, according to the plasma processing method of the embodiment, the impedance of the variable capacitors 87 and 87M during the ignition of plasma are set to be larger than the impedance of the variable capacitors 87 and 87M during the plasma processing. Thus, the amplitude potential of the antenna 83 with respect to the GND increases. As a result, plasma may easily be ignited. That is, plasma may be ignited with the relatively low power. Further, the potential between adjacent turns of the antenna 83 may be lowered, so that the occurrence of an abnormal discharge between turns may be reduced.

In the embodiment above, descriptions are made on a case where the plasma source is applied to a rotary-able type plasma processing apparatus that performs a film formation according to the ALD by rotating a rotary table with a substrate placed thereon. However, the present disclosure is not limited thereto. For example, the plasma source of the present disclosure may be applied to a single-wafer type apparatus that processes substrates one by one, or a batch type apparatus that processes a large number of substrates at one time by placing the substrates on a boat.

According to the present disclosure, plasma may be ignited with the relatively low power.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus comprising:
a vacuum container; and
a plasma source configured to generate plasma in the vacuum container and including:
an antenna,
an RF power supply connected to one end of the antenna and configured to supply an RF power to the antenna, and
a variable capacitor connected to a remaining end of the antenna and having a variable capacitance,
wherein the variable capacitor includes a plurality of fixed capacitance condensers that are connected in parallel to each other, and a switch, movable between an ON and an OFF position, that when in the OFF position is connected in series to one of the plurality of fixed capacitance condensers and,
a controller configured to control the plasma source to:
move the switch to the OFF position for igniting the plasma inside the vacuum container;
move the switch to the ON position for performing a plasma processing; and
set: 1) a frequency for the RF power to be supplied to the antenna, or 2) a capacitance of the variable capacitor; for each of 1) the switch in the OFF position for igniting the plasma, and 2) the switch in the ON position for the performing the plasma processing.

2. The plasma processing apparatus according to claim 1, wherein the variable capacitor includes a variable capacitance condenser.

3. The plasma processing apparatus according to claim 1, wherein the plasma source further includes a matching box of an inverted L-shaped circuit provided between the RF power supply and the antenna.

4. The plasma processing apparatus according to claim 1, wherein the controller is additionally configured to control the plasma source to
when the switch is in the OFF position, supply the RF power, wherein the frequency includes a first frequency, to the antenna to ignite the plasma inside the vacuum container, and
when the switch is in the OFF position, supply the RF power, wherein the frequency includes a second frequency, to the antenna to perform a plasma processing, and
wherein the first frequency is lower than the second frequency.

5. The plasma processing apparatus according to claim 1, wherein the controller is additionally configured to control the plasma source to
when the switch is in the OFF position, supply the RF power to the antenna in a state where the capacitance of the variable capacitor is set to a first capacitance, thereby igniting the plasma inside the vacuum container, and
when the switch is in the ON position, supply the RF power to the antenna in a state where the capacitance of the variable capacitor is set to a second capacitance, thereby performing a plasma processing, and
wherein the first capacitance is smaller than the second capacitance.

6. The plasma processing apparatus according to claim 1, wherein the controller is additionally configured to control the plasma source to
ignite the plasma in a state where an inside of the vacuum container is controlled to a pressure of 1 Torr (133 Pa) or more.

7. The plasma processing apparatus according to claim 1, further comprising:
a rotary table provided inside the vacuum container, and configured to place a plurality of substrates thereon in a circumferential direction of the rotary table;
a gas supply configured to supply a plasma processing gas to at least one of a plurality of areas spaced apart from each other in the circumferential direction of the rotary table via a separation area; and
a plasma processing area that surrounds the gas supply from above and beside,
wherein the plasma source is provided to face the rotary table, and configured to generate the plasma in the plasma processing area.

8. The plasma processing apparatus according to claim 7, wherein a Faraday shield is provided between the rotary table and the antenna.

9. A plasma processing method comprising:
providing a plasma processing apparatus including:
a vacuum container; and
a plasma source configured to generate plasma in the vacuum container and including:
an antenna,
an RF power supply connected to one end of the antenna and configured to supply an RF power to the antenna,
a variable capacitor connected to a remaining end of the antenna and having a variable capacitance, the variable capacitor including a plurality of fixed capacitance condensers that are connected in parallel to each other and a switch, moveable between an ON position and an OFF position, that when in the OFF position is connected in series to one of the plurality of fixed capacitance condensers, and the one end of the antenna being connected to the RF power supply and the remaining end of the antenna is grounded through the variable capacitor, and
a controller configured to control the plasma source to:
move the switch to the OFF position for igniting the plasma inside the vacuum container;
move the switch to the ON position for performing a plasma processing; and
set a frequency for the RF power to be supplied to the antenna, for each of 1) The switch in the OFF position for igniting the plasma, and 2) the switch in the ON position for the performing the plasma processing;
controlling the switch to move to the OFF position for generating the plasma inside the vacuum container by supplying a plasma processing gas into the vacuum container and supplying the RF power of a first frequency to the antenna for converting the plasma processing gas into plasma through an inductive coupling; and
after generating the plasma inside the vacuum container, controlling the switch to move to the ON position for the performing the plasma processing by supplying the plasma processing gas into the vacuum container and supplying the RF power of a second frequency to the antenna, wherein the first frequency is lower than the second frequency.

10. A plasma processing method comprising:
providing a plasma processing apparatus including:
  a vacuum container; and
  a plasma source configured to generate plasma in the vacuum container and including:
    an antenna,
    an RF power supply connected to one end of the antenna and configured to supply an RF power to the antenna,
    a variable capacitor connected to a remaining end of the antenna and having a variable capacitance, the variable capacitor including a plurality of fixed capacitance condensers that are connected in parallel to each other and a switch, moveable between an ON position and an OFF position, that when in the OFF position is connected in series to one of the plurality of fixed capacitance condensers, and the one end of the antenna being connected to the RF power supply and the remaining end of the antenna is grounded through the variable capacitor, and
  a controller configured to control the plasma source to:
    move the switch to the OFF position for igniting the plasma inside the vacuum container;
    move the switch to the ON position for performing a plasma processing; and
    set a capacitance of the variable capacitor, for each of 1) the switch in the OFF position for igniting the plasma, and 2) the switch in the ON position for the performing the plasma processing;
  controlling the switch to move to the OFF position for generating the plasma inside the vacuum container by supplying a plasma processing gas into the vacuum container and supplying the RF power to the antenna for converting the plasma processing gas into plasma through an inductive coupling; and
  after generating the plasma inside the vacuum container, controlling the switch to move to the ON position for the performing the plasma processing by supplying the plasma processing gas into the vacuum container and supplying the RF power to the antenna,
  wherein in the generating the plasma, the capacitance of the variable capacitor is set to be smaller than that in the performing the plasma processing.

11. The plasma processing apparatus according to claim 1, wherein the vacuum container includes:
  a rotary table having a rotation center at a center of the vacuum container and configured to revolve a plurality of substrates; and
  a housing provided above the rotary table,
    wherein a protrusion is formed on a lower surface of the housing to extend vertically toward the rotary table.

12. The plasma processing apparatus of claim 7, additionally comprising:
  a rotary table provided inside the vacuum container, and configured to place a plurality of substrates thereon in a circumferential direction of the rotary table; and
  the antenna being bendable and movable to positions proximate to a center of the rotary table.

* * * * *